(12) United States Patent
Kim

(10) Patent No.: US 8,011,989 B2
(45) Date of Patent: Sep. 6, 2011

(54) METHOD OF MAKING A PLASMA DISPLAY PANEL WITH A NOVEL CONNECTION STRUCTURE

(75) Inventor: Sung-Tae Kim, Gimpo-si (KR)

(73) Assignee: LG Electronics Inc., Seoul (KR)

( * ) Notice: Subject to any disclaimer, the term of this patent is extended or adjusted under 35 U.S.C. 154(b) by 194 days.

(21) Appl. No.: 12/465,012

(22) Filed: May 13, 2009

(65) Prior Publication Data

US 2009/0227172 A1    Sep. 10, 2009

Related U.S. Application Data

(62) Division of application No. 11/276,035, filed on Feb. 10, 2006, now Pat. No. 7,612,501.

(30) Foreign Application Priority Data

Feb. 17, 2005 (KR) .................. 10-2005-0013327

(51) Int. Cl.
*H01J 17/49* (2006.01)
*H01J 1/14* (2006.01)

(52) U.S. Cl. .......... 445/49; 313/581; 313/585; 313/587; 315/169.1

(58) Field of Classification Search .......... 313/581–587; 315/169.4
See application file for complete search history.

(56) References Cited

U.S. PATENT DOCUMENTS

| | | | |
|---|---|---|---|
| 5,818,168 A | 10/1998 | Ushifusa | |
| 5,883,462 A | 3/1999 | Ushifusa | |
| 6,086,441 A | 7/2000 | Akiguchi | |
| 6,486,611 B2 | 11/2002 | Tokunaga | |
| 6,586,880 B2 | 7/2003 | Amemiya | |
| 6,614,183 B2 | 9/2003 | Masuda | |
| 6,639,363 B2 | 10/2003 | Amatsuchi | |
| 7,078,859 B2 | 7/2006 | Yoshihara | |
| 2003/0011318 A1 | 1/2003 | Kim | |
| 2003/0089600 A1 | 5/2003 | Natsuhara | |
| 2003/0227426 A1 | 12/2003 | Yoshinari | |
| 2004/0056595 A1 | 3/2004 | Shiokawa | |
| 2004/0090181 A1 | 5/2004 | Yasui | |
| 2005/0006650 A1 | 1/2005 | Choi | |
| 2005/0077823 A1 | 4/2005 | Song | |

FOREIGN PATENT DOCUMENTS

| | | |
|---|---|---|
| CN | 1607629 | 4/2005 |
| EP | 1 496 537 | 1/2005 |
| JP | 63-066989 A | 3/1988 |
| JP | 04-015993 Y2 | 4/1992 |
| JP | 05-258830 A | 10/1993 |
| JP | 08-046314 A | 2/1996 |
| JP | 08-162755 A | 6/1996 |

(Continued)

OTHER PUBLICATIONS

Office Action dated Dec. 5, 2008 for Application No. CN200610004292.1, with English-language translation.

(Continued)

*Primary Examiner* — Anne Hines
*Assistant Examiner* — Tracie Green
(74) *Attorney, Agent, or Firm* — Fish & Richardson P.C.

(57) ABSTRACT

A plasma display apparatus comprising a connector is provided. The plasma display apparatus comprises a plasma display panel comprising an electrode of a predetermined width and a connector comprising an electrode line of a width narrower than the predetermined width of the electrode to supply a driving signal to the electrode. A distance between the electrode line and an adjacent electrode line is longer than a distance between the electrode and an adjacent electrode.

4 Claims, 4 Drawing Sheets

FOREIGN PATENT DOCUMENTS

| | | |
|---|---|---|
| JP | 11-144621 A | 5/1999 |
| JP | 11144621 | 5/1999 |
| JP | 2000-049432 A | 2/2000 |
| JP | 2003-218492 A | 7/2003 |
| JP | 2005-031684 A | 2/2005 |

OTHER PUBLICATIONS

European Search Report dated Feb. 26, 2009 for Application No. 06290245.7-228, 8 pages.

Japanese Office Action dated Feb. 22, 2011 for Application No. 2006-038762, with English translation, 8 pages.

METHOD OF MAKING A PLASMA DISPLAY PANEL WITH A NOVEL CONNECTION STRUCTURE

CROSS-REFERENCE TO RELATED APPLICATIONS

This application is a divisional of U.S. application Ser. No. 11/276,035, filed Feb. 10, 2006, now pending, which claims priority under 35 U.S.C. §119(a) to Patent Application No 10-2005-0013327 filed in Korea on Feb. 17, 2005, the entire contents of which are hereby incorporated by reference.

BACKGROUND OF THE INVENTION

1. Field of the Invention

The document relates to a plasma display apparatus comprising a connector.

2. Description of the Background Art

Generally, a plasma display apparatus comprises a plasma display panel and a driving unit for driving the plasma display panel. The plasma display apparatus has excellent characteristics such as self-luminance, a high-speed response and a wide viewing angle, and thus the plasma display apparatus has been widely adopted.

The plasma display apparatus comprises a connector for supplying a driving signal to electrodes of the plasma display panel. Use of the connector reduces manufacturing costs and allows for greater automation of a manufacturing process. The connector comprises COF (chip-on-film), TCP (tape carrier package) or FPC (flexible printed circuit).

FIGS. 1 and 2 are cross-sectional views of a connector of a related art plasma display apparatus. As shown in FIG. 1, a conductive adhesive film 5 comprising conductive particles is temporarily compressed on electrode lines 3 of a connector 1. Afterwards, as shown in FIG. 2, when heat is applied to the conductive adhesive film 5, the conductive adhesive film 5 is compressed between a plasma display panel 2 and the connector 1 by the applied force with respect to a compression reference point. Thus, the conductive adhesive film 5 expanded by the heat connects the electrode line 3 of the conductive adhesive film 5 to an electrode 4 of the plasma display panel 2. The conductive adhesive film 5 may be an anisotropic conductive film (ACF).

A width W1 of the electrode line 3 of the connector 1 is equal to a width W2 of the electrode 4 of the plasma display panel 2. When the electrode 4 of the plasma display panel 2 is imperfectly aligned with the electrode line 3 of the connector 1 in a compression process, an insulation distance L1 between the electrode lines 3 may decrease. When the insulation distance L1 between the electrode lines 3 decreases, the insulation between the electrode lines 3 is insufficient due to the generation of a migration of an electrode material.

The migration of the electrode material in the electrode 4 of the plasma display panel 2 is that the ionized electrode material is moved due to the electric potential difference between the electrode lines 3. When the migration is generated in the electrode 4 of the plasma display panel 2, the electrode material ionized moves to the adjacent electrode line 3 of the connector 1.

In other words, the electrode material is hydrolyzed by water absorbed on the surface of the electrode and then the electrode material is ionized. The electrode material ionized moves to the adjacent electrode line 3 along the electrode line 3 due to the electric potential difference between the electrode lines 3 which causes the generation of a short between the electrode lines 3. Further, since the electrode material ionized moves to the adjacent electrode line 3, the electrodes may be opened. In particular, when the electrode 4 of the plasma display panel 2 comprises silver (Ag), the migration is generated more remarkably. Thus, a likelihood of the generation of the short between the electrode lines 3 is higher.

Accordingly, when the width W1 of the electrode line 3 is equal to the width W2 of the electrode 4, the insulation distance L1 decreases due to the imperfect alignment between the electrode line 3 and the electrode 4. As a result, the likelihood of the generation of the short between the electrode lines 3 due to the migration of the electrode material is high.

FIG. 3 is a cross-sectional view of another connector of a related art plasma display apparatus. As shown in FIG. 3, when a width $a_1$ of an electrode line 3 is wider than a width $b_1$ of an electrode 4, a likelihood of the generation of a short between the electrode lines 3 due to the migration of the electrode material is high. In other words, when the width $a_1$ of the electrode line 3 is wider than the width $b_1$ of the electrode 4, an insulation distance L1 between the electrode lines 3 decreases. Thus, the likelihood of the generation of the short between the electrode lines 3 due to the migration of the electrode material is high. Furthermore, when the electrode 4 is imperfectly aligned with the electrode line 3, the insulation distance L1 between the electrode lines 3 further decreases. Thus, the likelihood of the generation of the short between the electrode lines 3 due to the migration of the electrode material is higher.

SUMMARY OF THE INVENTION

Accordingly, an object of the present invention is to solve at least the problems and disadvantages of the related art.

Embodiments of the present invention provide a plasma display apparatus comprising a connector having a structure of an electrode line capable of securing an insulation distance.

According to one aspect of the present invention, there is a plasma display apparatus comprising a plasma display panel comprising a plasma display panel comprising an electrode and a connector comprising an electrode line connected to the electrode to supply a driving pulse to the electrode, and a width of the electrode line is narrower than the width of the electrode.

According to another aspect of the present invention, there is a plasma display apparatus comprising a plasma display panel comprising an electrode and a connector comprising an electrode line connected to the electrode to supply a driving pulse to the electrode, and a width of the mostlower part of a section of the electrode line opposed to the electrode is narrower than the width of the mostupper part of the section of the electrode line, and the width of the mostupper part of the section of the electrode line is narrower than the width of the electrode.

According to still another aspect of the present invention, there is a plasma display apparatus comprising a plasma display panel comprising an electrode and a connector comprising an electrode line connected to the electrode to supply a driving pulse to the electrode, and a width of the mostlower part of a section of the electrode line opposed to the electrode is same as the width of the mostupper part of the section of the electrode line, and the width of the mostupper part is narrower than the width of the electrode.

The plasma display apparatus according to the embodiments of the present invention can reduce a likelihood of the generation of a short between the electrode lines due to the migration of an electrode material.

The plasma display apparatus according to the embodiments of the present invention can reduce a likelihood of the generation of a short between the electrode lines due to the migration when the electrode lines is imperfectly aligned with the electrode.

BRIEF DESCRIPTION OF THE DRAWINGS

The embodiment of the invention will be described in detail with reference to the following drawings in which like numerals refer to like elements.

DETAILED DESCRIPTION OF PREFERRED EMBODIMENTS

Figure 1:
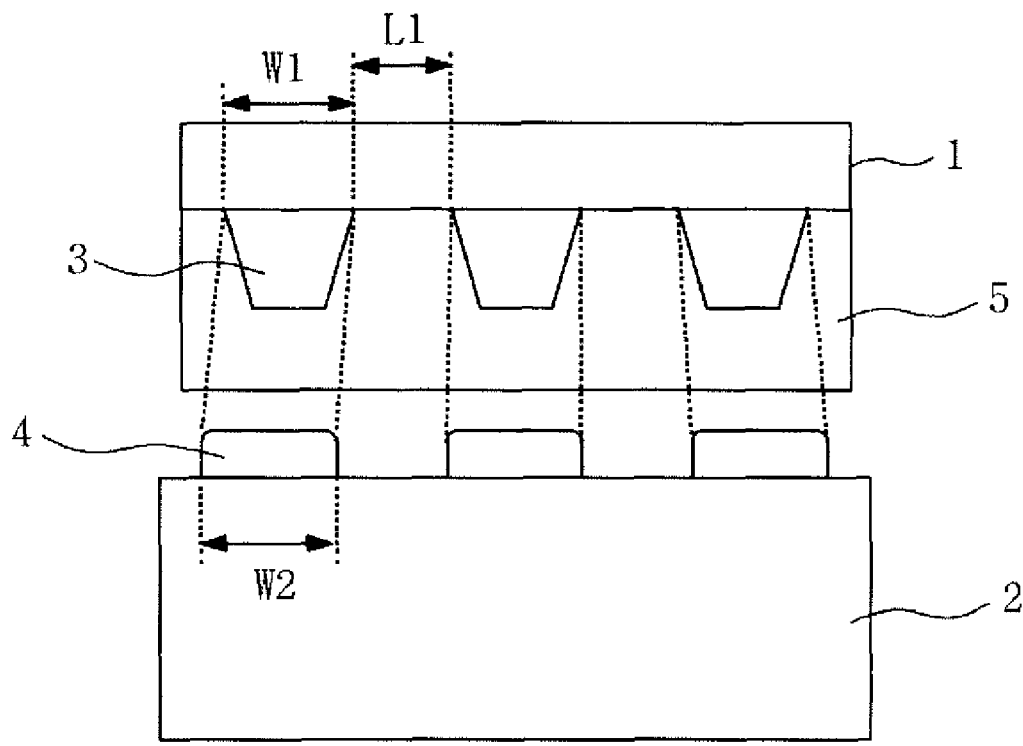
FIGS. 1 and 2 are cross-sectional views of a connector of a related art plasma display apparatus.

Embodiments of the present invention will be described in a more detailed manner with reference to the drawings.

A plasma display apparatus according to an embodiment of the present invention comprises a plasma display panel comprising an electrode and a connector comprising an electrode line connected to the electrode to supply a driving pulse to the electrode, and a width of the electrode line is narrower than the width of the electrode.

The electrode may comprise at least one of a scan electrode, a sustain electrode or a data electrode.

The electrode may comprise cooper (Cu) or silver (Ag).

The width of the electrode may be equal to or more than 1.1 times the width of the electrode line to less than or equal to 1.5 times the width of the electrode line.

A conductive adhesive film may be interposed between the electrode and the electrode line, and the conductive adhesive film compressed by the electrode and the electrode line may connect the electrode to the electrode line.

The conductive adhesive film may be an anisotropic conductive film (ACF).

A distance between the electrode line and an adjacent electrode line may be longer than a distance between the electrode and an adjacent electrode.

The electrode line may be plated with nickel.

A nickel thin layer may be formed on a surface of the electrode line.

A nickel thin layer may be formed on a surface of the electrode line overlapped with the electrode.

The connector may comprise at least one of TCP, COF or FPC.

A plasma display apparatus according to another embodiment of the present invention comprises a plasma display panel comprising an electrode and a connector comprising an electrode line connected to the electrode to supply a driving pulse to the electrode, and a width of the mostlower part of a section of the electrode line opposed to the electrode is narrower than the width of the mostupper part of the section of the electrode line, and the width of the mostupper part of the section of the electrode line is narrower than the width of the electrode.

The electrode may comprise at least one of a scan electrode, a sustain electrode or a data electrode.

The electrode may comprise Cu or Ag.

The width of the electrode is equal to or more than 1.1 times the width of the mostupper part to less than or equal to 1.5 times the width of the mostupper part.

A distance between the electrode line and an adjacent electrode line may be longer than a distance between the electrode and an adjacent electrode.

A shape of the section of the electrode line may be a trapezoid.

A plasma display apparatus according to still another embodiment of the present invention comprises a plasma display panel comprising an electrode and a connector comprising an electrode line connected to the electrode to supply a driving pulse to the electrode, and a width of the mostlower part of a section of the electrode line opposed to the electrode is same as the width of the mostupper part of the section of the electrode line, and the width of the mostupper part is narrower than the width of the electrode.

The electrode may comprise at least one of a scan electrode, a sustain electrode or a data electrode.

The electrode may comprise Cu or Ag.

The width of the electrode is equal to or more than 1.1 times the width of the mostupper part to less than or equal to 1.5 times the width of the mostupper part.

A distance between the electrode line and an adjacent electrode line may be longer than a distance between the electrode and an adjacent electrode.

A shape of the section of the electrode line may be a square or a rectangle.

Hereinafter, exemplary embodiments of the present invention will be described in detail with reference to the attached drawings.

Figure 4:
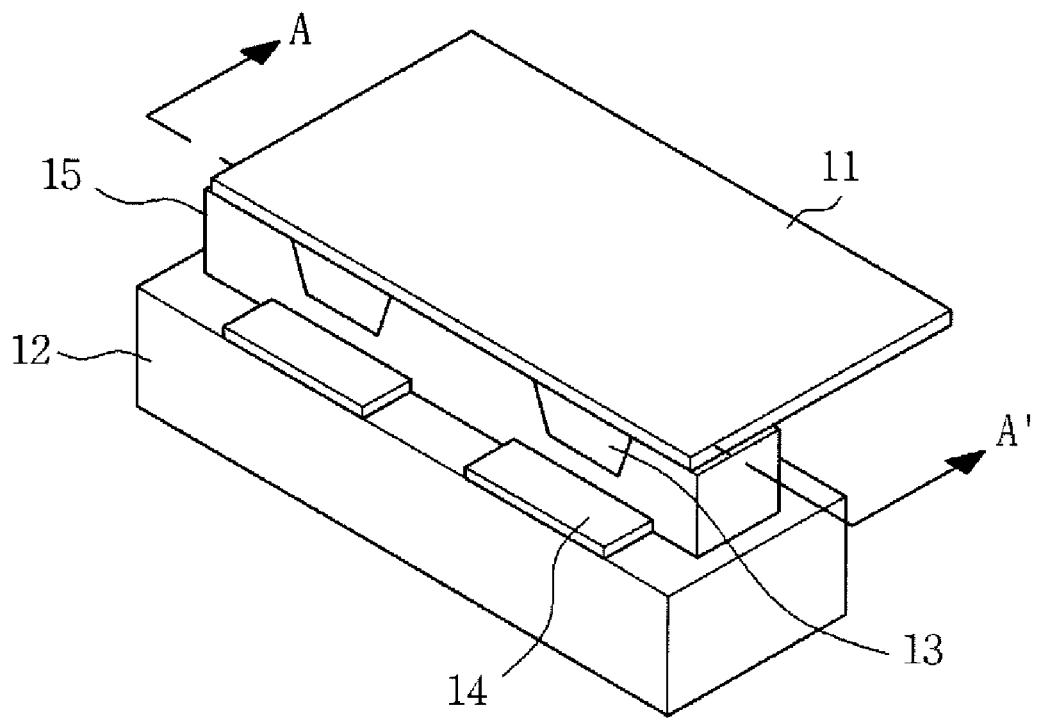
FIG. 4 is a plane view of a plasma display apparatus according to a first embodiment of the present invention.

FIG. 4 is a plane view of a plasma display apparatus according to a first embodiment of the present invention. As shown in FIG. 4, the plasma display apparatus according to the first embodiment of the present invention comprises a plasma display panel 12 comprising an electrode 14 and a connector 11 comprising an electrode line 13 connected to the electrode 14 to supply a driving pulse to the electrode 14. A width of the electrode line 13 is narrower than the width of the electrode 14.

The surface of the electrode line 13 may be plated with nickel. A nickel thin layer may be formed on the surface of the electrode line 13. The nickel thin layer may be formed on a surface of the electrode line 13 overlapped with the electrode 14.

The electrode 14 comprises at least one of a scan electrode, a sustain electrode or a data electrode. In other word, a width of any one of the scan electrode, a sustain electrode or a data electrode may be greater than the width of the electrode line 13. And the width of each of two electrodes of the scan electrode, a sustain electrode or a data electrode may be greater than the width of the electrode line 13. And the width of each of the scan electrode, a sustain electrode or a data electrode may be greater than the width of the electrode line 13.

Moreover, the electrode 14 comprises copper (Cu) or silver (Ag). The connector 11 comprises any one of COF (chip-on-film), TCP (tape carrier package) or FPC (flexible printed circuit).

A conductive adhesive film 15 is coalesced with the plasma display panel 12 and the connector 11 to provide an insulation between the electrodes 14 and an insulation between the electrode lines 13. The conductive adhesive film 15 may be an anisotropic conductive film (ACF).

Figure 5:
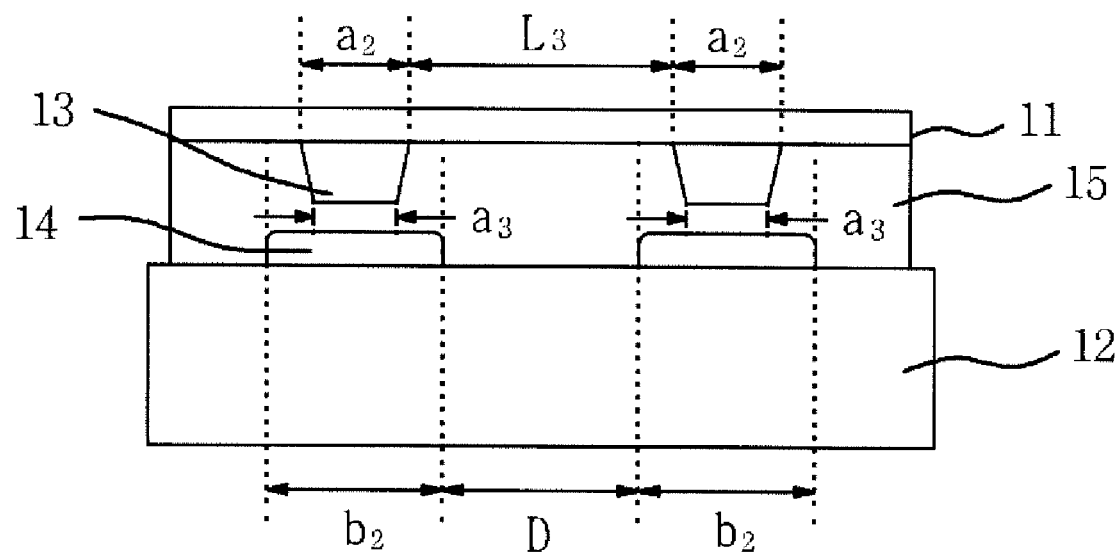
FIG. 5 is a cross-sectional view of the plasma display apparatus according to the first embodiment of the present invention.

FIG. 5 is a cross-sectional view taken along lines A-A' of FIG. 4. As shown in FIG. 5, the electrode line 13 of the connector 11 is electrically connected to the electrode 14 of the plasma display panel 12 by the conductive adhesive film 15.

The conductive adhesive film 15 between the connector 11 and the plasma display panel 12 provides the insulation between the electrodes 14 and the insulation between the electrode lines 14.

As shown in FIG. 5, a width $a_3$ of the mostlowerpart of a section of the electrode line 13 opposed to the electrode 14 is narrower than the width $a_2$ of the mostupper part of the section of the electrode line, and the width $a_2$ of the mostupper part of the section of the electrode line 13 is narrower than the width $b_2$ of the electrode 14. A shape of the section of the electrode line is a trapezoid.

Therefore, an insulation distance $L_3$ between the electrode lines 13 is longer than a distance D between the electrodes 14. The width $b_2$ of the electrode 14 is equal to or more than 1.1 times the width $a_2$ of the mostupper part to less than or equal to 1.5 times the width $a_2$ of the mostupper part.

Figure 2:
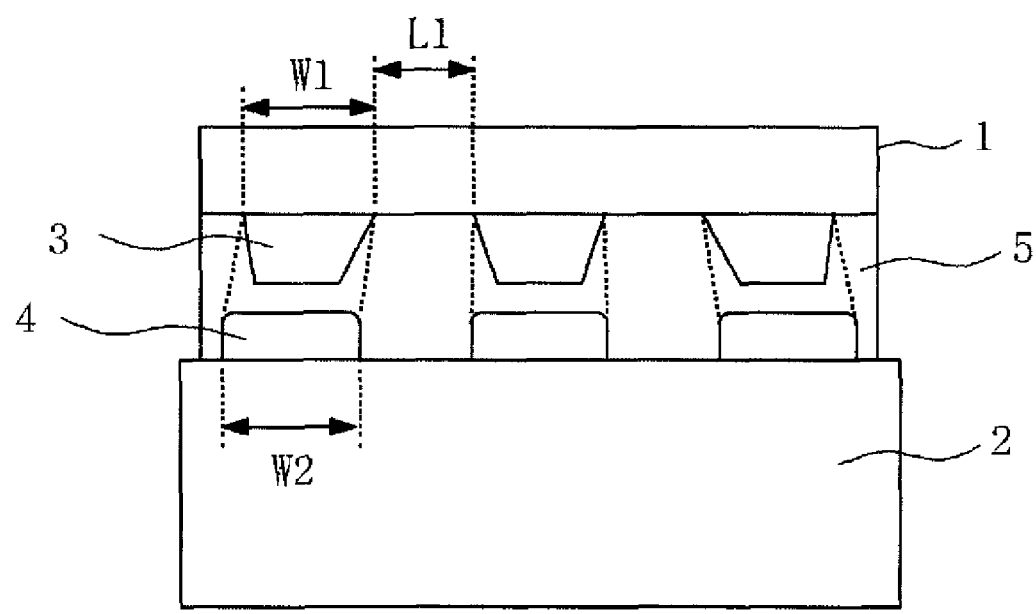
Figure 3:
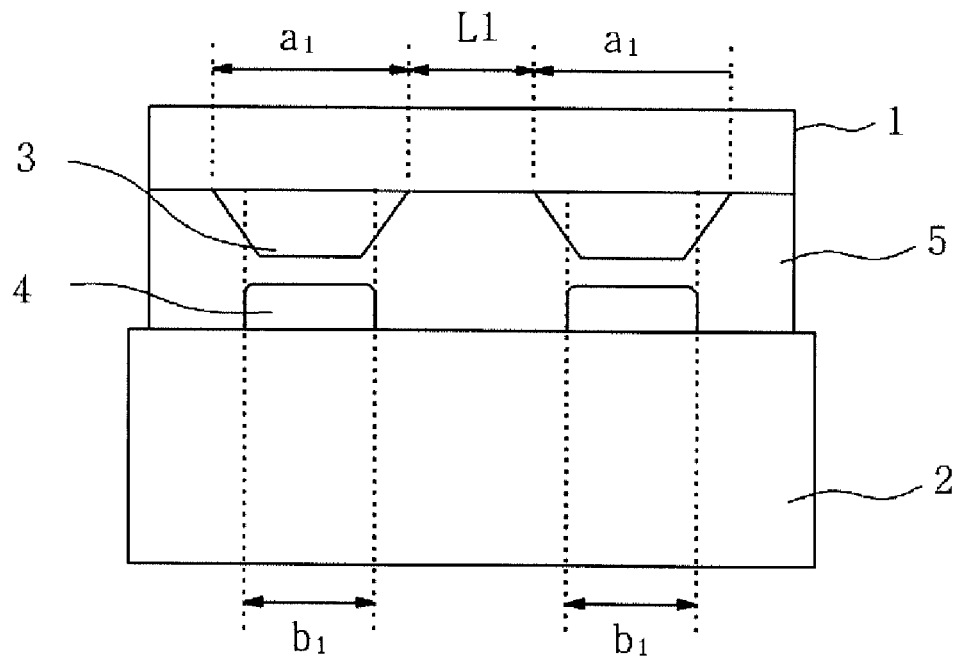
FIG. 3 is a cross-sectional view of another connector of a related art plasma display apparatus.

Since the insulation distance $L_3$ between the electrode lines 13 is longer than the insulation distances L1 of FIGS. 2 and 3, the likelihood of generation of a short of between the electrode lines 13 due to a migration of an electrode material decreases.

The conductive adhesive film 15 is temporarily compressed on the electrode line 13 of the connector 11. The electrode lines 13 is aligned with the electrode 14 of the plasma display panel 12 and then the conductive adhesive film 15 is compressed on the connector 11 and the plasma display panel 12 by the applied force with respect to a compression reference point.

Since the width $a_2$ of the mostupper part is narrower than the width $b_2$ of the electrode 14 of the plasma display panel 12 in the first embodiment of the present invention, although the electrode lines 13 are imperfectly aligned with the electrode 14 of the plasma display panel 12, the likelihood of generation of the short of between the electrode lines 13 by the migration of the electrode material decreases.

In other words, since the width $a_2$ of the mostupper part is narrower than the width $b_2$ of the electrode 14 of the plasma display panel 12, the insulation distance $L_3$ between the electrode lines 13 is longer than the insulation distances L1 of FIGS. 2 and 3. Thus, the likelihood of the generation of the short of between the electrode lines 13 by the migration of the electrode material decreases. In particular, when the electrode 14 comprises Ag, the likelihood of the generation of the short of between the electrode lines 13 due to the migration of the electrode 14 decreases.

Figure 6:
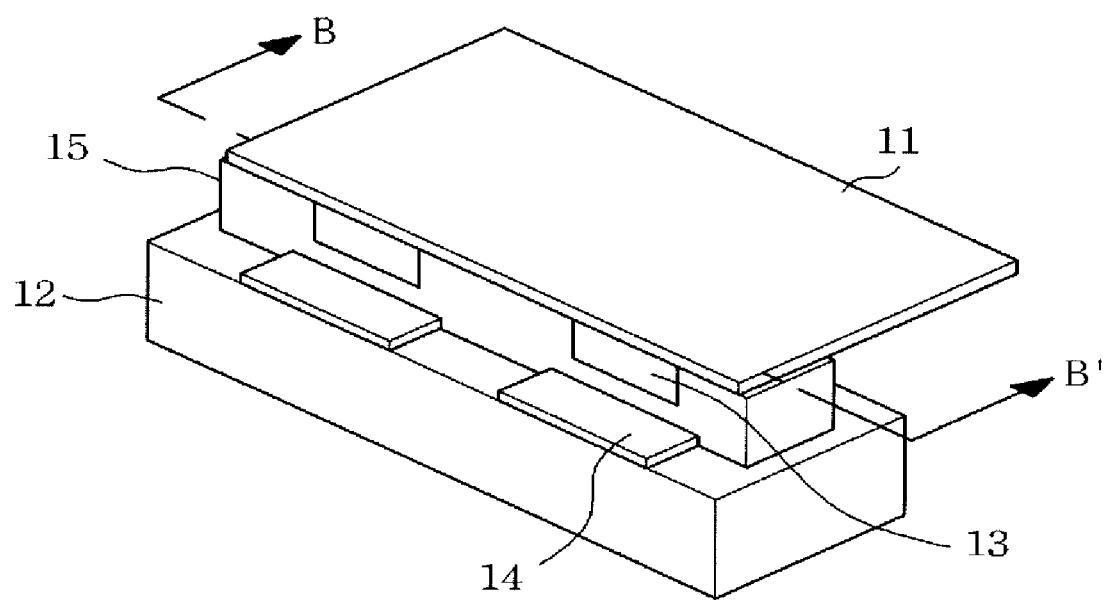
FIG. 6 is a plane view of a plasma display apparatus according to a second embodiment of the present invention.
Figure 7:
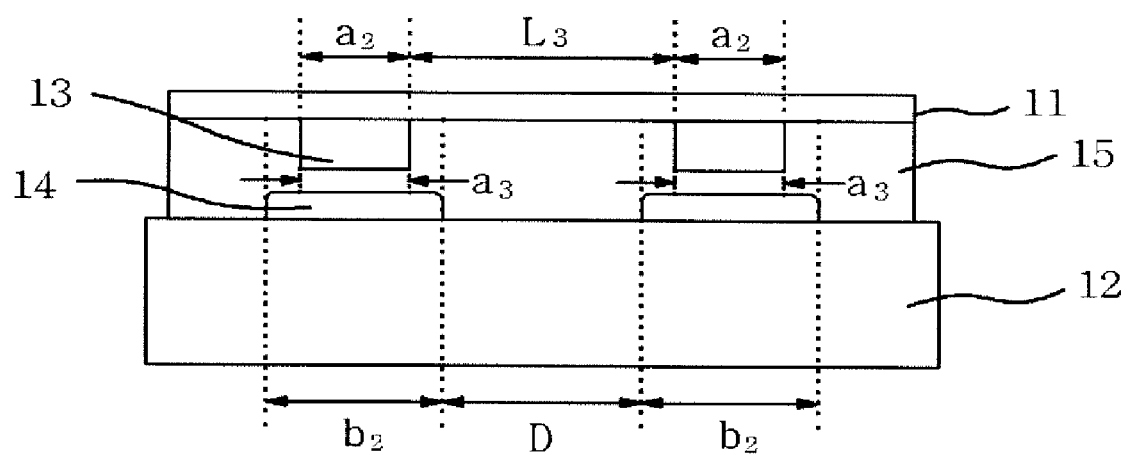
FIG. 7 is a cross-sectional view of the plasma display apparatus according to the second embodiment of the present invention.

FIG. 6 is a plane view of a plasma display apparatus according to a second embodiment of the present invention, and FIG. 7 is a cross-sectional view of the plasma display apparatus according to the second embodiment of the present invention. FIG. 7 is a cross-sectional view taken along lines B-B' of FIG. 6. A width $a_3$ of the mostlower part of a section of an electrode line 13 opposed to the electrode 14 is same as the width $a_2$ of the mostupper part of the section of the electrode line 13, and the width $a_2$ of the mostupper part of the section of the electrode line 13 is narrower than the width $b_2$ of the electrode 14. A shape of the section of the electrode line is a square or a rectangle.

The surface of the electrode line 13 may be plated with nickel. Further, a nickel thin layer may be formed on the surface of the electrode line 13. The nickel thin layer may be formed on a surface of the electrode line 13 overlapped with the electrode 14.

An electrode 14 comprises at least one of a scan electrode, a sustain electrode or a data electrode, a width of any one of the scan electrode, a sustain electrode or a data electrode may be greater than the width of the electrode line 13. And the width of each of two electrodes of the scan electrode, a sustain electrode or a data electrode may be greater than the width of the electrode line 13. And the width of each of the scan electrode, a sustain electrode or a data electrode may be greater than the width of the electrode line 13.

Moreover, the electrode 14 comprises Cu or Ag. A connector 11 is any one of COF, TCP or FPC. A conductive adhesive film 15 is attached with a plasma display panel 12 and the connector 11 to provide an insulation between the electrodes 14 and an insulation between the electrode lines 13. The conductive adhesive film 15 may be an ACF.

As shown in FIGS. 6 and 7, since the width $a_2$ of the mostupper part is narrower than a width $b_2$ of the electrode 14 of the plasma display panel 12, an insulation distance $L_3$ between the electrode lines 13 is longer than the insulation distances L1 of FIGS. 2 and 3. The width $b_2$ of the electrode 14 is equal to or more than 1.1 times the width $a_2$ of the mostupper part to less than or equal to 1.5 times the width $a_2$ of the mostupper part.

The conductive adhesive film 15 is temporarily compressed on the electrode line 13 of the connector 11. The electrode lines 13 is aligned with the electrode 14 of the plasma display panel 12 and then the conductive adhesive film 15 is compressed on the connector 11 and the plasma display panel 12 by the applied force with respect to a compression reference point.

The conductive adhesive film 15 is firstly compressed on the electrode line 13 of the connector 11 before the electrode 14 is compressed on the conductive adhesive film 15 of the plasma display panel 12 in the first and second embodiments of the present invention. However, the conductive adhesive film 15 may be firstly compressed on the electrode 14 of the plasma display panel 12.

The embodiment of the invention being thus described, the same may be varied in many ways. Such variations are not to be regarded as a departure from the spirit and scope of the invention, and all such modifications as would be obvious to one skilled in the art are intended to be included within the scope of the following claims.

What is claimed is:

1. A method comprising:
    forming an electrode on a plasma display panel;
    forming an electrode line on a connector, the electrode line configured to supply a driving pulse to the electrode, and the electrode line exhibiting a quadrilateral-shaped cross-section, with a width of a first side of the electrode line that contacts the connector and a width of a parallel second side of the electrode line nearest to the electrode each being less than a width of the electrode; and
    forming a conductive adhesive film layer between the electrode and the electrode line,
    wherein a distance between the electrode line and an adjacent electrode line is greater than a distance between the electrode and an adjacent electrode,
    wherein a distance between the parallel second side of the electrode line and the parallel second side of the adjacent electrode line is greater than a distance between the first side of the electrode line and the first side of the adjacent electrode line, and wherein the distance between the first side of the electrode line and the first side of the adjacent electrode line is greater than the distance between the electrode and the adjacent electrode.

2. The method of claim 1, wherein the electrode line exhibits a rectangular or square-shaped cross-section.

3. The method of claim 1, wherein the electrode line exhibits a trapezoidal cross-section.

4. The method of claim 1, wherein the width of the first side of the electrode line that contacts the connector is greater than the width of the parallel second side of the electrode line nearest to the electrode.

* * * * *